(12) United States Patent
Seko et al.

(10) Patent No.: US 9,726,340 B2
(45) Date of Patent: Aug. 8, 2017

(54) SEMICONDUCTOR LIGHT-EMITTING APPARATUS AND VEHICLE HEADLIGHT

(71) Applicant: Stanley Electric Co., Ltd., Tokyo (JP)

(72) Inventors: Toshihiro Seko, Tokyo (JP); Kosaburo Ito, Tokyo (JP); Kenji Akisada, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 97 days.

(21) Appl. No.: 14/745,402

(22) Filed: Jun. 20, 2015

(65) Prior Publication Data

US 2015/0372200 A1 Dec. 24, 2015

(30) Foreign Application Priority Data

Jun. 23, 2014 (JP) ................. 2014-127796

(51) Int. Cl.
*F21S 8/10* (2006.01)
*H01L 33/48* (2010.01)

(52) U.S. Cl.
CPC ......... *F21S 48/125* (2013.01); *F21S 48/1145* (2013.01); *F21S 48/1159* (2013.01); *F21S 48/1163* (2013.01); *H01L 33/486* (2013.01); *F21S 48/1323* (2013.01); *H01L 2224/16245* (2013.01); *H01L 2224/45144* (2013.01);
(Continued)

(58) Field of Classification Search
CPC .. F21S 48/115; F21S 48/1154; F21S 48/1159; F21S 48/1163; F21S 48/125; H01L 33/486
See application file for complete search history.

(56) References Cited

U.S. PATENT DOCUMENTS 8,115,106 B2 2/2012 Tanaka et al.
8,373,182 B2 2/2013 Seko et al.
(Continued)

FOREIGN PATENT DOCUMENTS

JP 2003-282952 A 10/2003
JP 2007-188059 A 7/2007

*Primary Examiner* — Robert May
(74) *Attorney, Agent, or Firm* — Kenealy Vaidya LLP

(57) ABSTRACT

A reliable semiconductor light-emitting apparatus and a headlight using the light-emitting apparatus provided with a light source module including a semiconductor light-emitting device and a wavelength converting module including a wavelength converting layer. The wavelength converting module can include a base having a mounting board, which mounts the wavelength converting layer via metallic bumps, and the base can be configured to attach the light source module directly or via a connecting guide including an optical fiber, and therefore can transmit light emitted from the light-emitting device towards the wavelength converting layer while efficiently radiating heat generated from the wavelength converting layer. Thus, the disclosed subject matter can provide reliable semiconductor light-emitting apparatuses having a high thermal resistance that can emit various color lights having favorable optical characteristics, which can also include the optical fiber, and which can be used for the headlight that can provide a favorable light distribution pattern.

20 Claims, 9 Drawing Sheets

(52) U.S. Cl.
CPC ........... *H01L 2224/48091* (2013.01); *H01L 2224/73265* (2013.01)

(56) References Cited

U.S. PATENT DOCUMENTS

| | | | | |
|---|---|---|---|---|
| 8,860,061 B2* | 10/2014 | Kotani | .................... | H01L 33/54 257/88 |
| 2014/0197445 A1* | 7/2014 | Saito | ..................... | H01L 33/642 257/99 |
| 2015/0377440 A1* | 12/2015 | Reitegger | ............ | F21S 48/1104 362/520 |

* cited by examiner

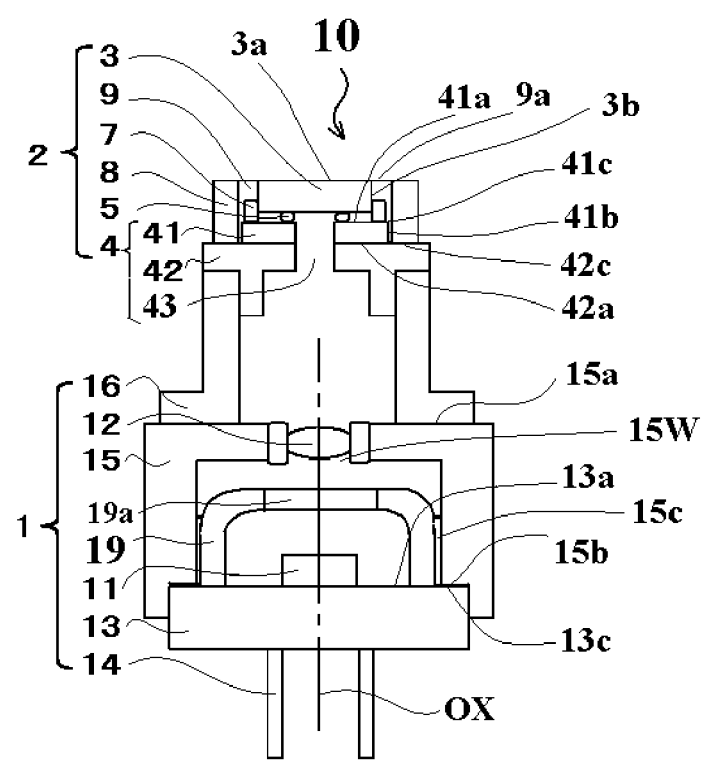

FIG. 4a Exemplary embodiment
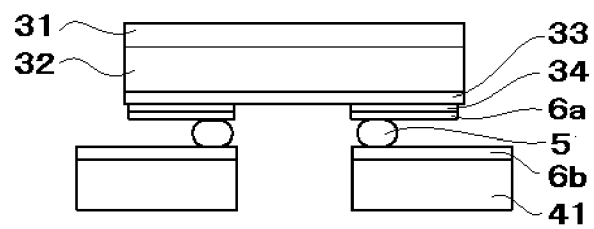
FIG. 4b Comparative embodiment
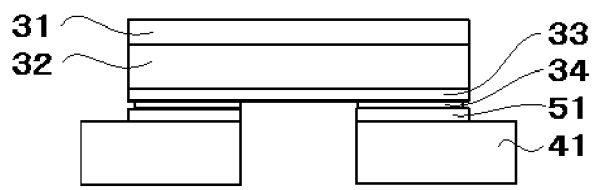

SEMICONDUCTOR LIGHT-EMITTING APPARATUS AND VEHICLE HEADLIGHT

This application claims the priority benefit under 35 U.S.C. §119 of Japanese Patent Application No. 2014-127796 filed on Jun. 23, 2014, which is hereby incorporated in its entirety by reference.

BACKGROUND

1. Field

The presently disclosed subject matter relates to semiconductor light-emitting apparatuses in which light emitted from a semiconductor light-emitting device is wavelength-converted by a wavelength converting layer, and to vehicle headlights using the semiconductor light-emitting apparatuses. More particularly, the disclosed subject matter relates to reliable semiconductor light-emitting apparatus having favorable optical characteristics and a high thermal resistance, which can be used for a vehicle lamp and the like, and which can also include an optical fiber, and to the vehicle headlights using such light-emitting apparatuses.

2. Description of the Related Art

Semiconductor light-emitting devices, in which a part of light emitted from a semiconductor light-emitting chip is converted into light having a different wavelength by a wavelength converting layer and in which a mixture light including the light having the different wavelength mixed with the light emitted directly from the light-emitting chip is emitted, have been used as a light source for various lighting units. In this case, semiconductor light-emitting devices, in which the semiconductor light-emitting chip may be located at a desired position by using an optical fiber, have also been known.

Conventional semiconductor light-emitting devices including a wavelength converting layer and an optical fiber are disclosed in Patent Document No. 1 (Japanese Patent Application Laid Open JP2007-188059). FIG. 9 is a schematic side cross-sectional exploded view including partial side cross-sectional views showing a conventional semiconductor light-emitting device, which is disclosed in Patent Document No. 1.

The conventional semiconductor light-emitting device 80 includes: a wavelength converting layer 85; a cap 84 including a first incorporable portion 84-1 and a second incorporable portion 84-2, wherein the wavelength converting layer 85 is incorporated into the second incorporable portion 84-2 via a glass 86 and the like by a heat-welding; an optical fiber cable 83 including a ferrule 81, a flange 82, an optical fiber 83A and a light source 83B being located at an end portion of the optical fiber 83A, another end portion of the optical fiber 83A covered with the ferrule 81 so that an end of the optical fiber 83A is exposed from the ferrule 81, and the ferrule 81 attached to the flange 82 along with the optical fiber 83A, which is covered by the flange 82; and wherein the ferrule 81 of the optical fiber cable 83 is attached to the second incorporable portion 84-2 by yttrium aluminum garnet (YAG) welding 88.

Accordingly, the conventional semiconductor light-emitting device 80 may emit a mixture light including a part of light emitted directly from the light source 83B with light having a different wavelength wavelength-converted by the wavelength converting layer 85 using another part of the light emitted directly from the light source 83B. In this case, when a blue LED chip is used as the light source 83B and when a yellow phosphor such as YAG is used as the wavelength converting layer 85, the conventional semiconductor light-emitting device 80 may substantially white light by an additive color mixture of an excited yellow light emitted from the yellow phosphor and a part of the blue light emitted from the blue LED chip, and therefore may used as a light source for a vehicle headlight, etc.

However, a large amount of strong lights may be required to brightly illuminate roadway surfaces under various conditions such as a rainy weather, a misty roadway surface and the like as the light source for the vehicle headlight. In such a structure, when the large amount of strong lights is emitted into the wavelength converting layer 85 in a harsh environment for a long time, characteristics such as an optical performance and the like of the wavelength converting layer 85 may degrade due to a high temperature thereof, a heat shock of the high temperature and a low temperature, etc. Thereby, optical characteristics of the semiconductor light-emitting device 80 may also degrade.

In addition, the conventional semiconductor light-emitting 80 may leak slightly light from a very small crack between the cap 84 and the wavelength converting layer 85, which may be caused by a metaphysical variation in the above-described structure. Therefore, further improvements of the structure may be required to use as a light source for a vehicle leadlight, etc. Moreover, semiconductor light-emitting devices integrated with the light source 83B, which does not include the optical fiber cable 83, is also required in accordance with designs of a vehicle, vehicle lamps of the vehicle, etc.

The above-referenced Patent Documents and additional Patent Documents are listed below, and are hereby incorporated with their English abstracts in their entireties.
1. Patent Document No. 1: Japanese Patent Application Laid Open JP2007-188059
2. Patent Document No. 2: U.S. Patent Publication No. US-2014-0197445-A1
3. Patent document No. 3: U.S. patent application Ser. No. 14/626,997
4. Patent document No. 4: U.S. Pat. No. 8,373,182
5. Patent document No. 5: U.S. Pat. No. 8,860,061

The presently disclosed subject matter has been devised to consider the above and other problems, features, and characteristics in the conventional art devices. Embodiments of the disclosed subject matter can include reliable semiconductor light-emitting apparatuses that can emit a wavelength-converted light having favorable optical characteristics and a high thermal resistance, which can be used for a vehicle lamp and the like, and which can also include an optical fiber. Accordingly, the semiconductor light-emitting apparatuses can emit the wavelength-converted light including a substantially white color tone having a high intensity and a high contrast between a light-emitting surface and a non-light-emitting surface from a small light-emitting surface, which can be used for lighting units such as a vehicle headlight that controls light emitted from the light-emitting apparatus using a reflector and/or a projector lens. The disclosed subject matter can also include a vehicle headlight using the semiconductor light-emitting apparatuses that can form a light distribution pattern including a horizontal cut-off line having a high contrast with a simple structure, which is formed by using a light distribution pattern including a light-emitting line having a high contrast emitted from the light-emitting surface of the light-emitting apparatus.

SUMMARY

The presently disclosed subject matter has been devised in view of the above and other problems, features, and characteristics in the conventional art, and to make changes to existing semiconductor light-emitting apparatuses. Thus, an aspect of the disclosed subject matter provides reliable semiconductor light-emitting apparatuses having a high thermal resistance that can emit various color lights including a substantially white color light having favorable optical characteristics, which can be used for a vehicle lamp and the like, and which can also include an optical fiber. Another aspect of the disclosed subject matter provides vehicle headlights using the reliable semiconductor light-emitting apparatuses, which can provide a favorable light distribution pattern, even when the semiconductor light-emitting apparatuses have been emitted for a long time in a small sealed housing.

According to an aspect of the disclosed subject matter, a semiconductor light-emitting apparatus can include a light source module and a wavelength converting module. The light source module can include: a stem having a stem top surface and a stem outer circumference located on the stem top surface; a semiconductor light-emitting device having an optical axis mounted on the stem top surface of the stem; a casing formed in a dome shape, being attached to the stem outer circumference of the stem, and a light-emitting window of the casing being configured to transmit light emitted from the light-emitting device along the optical axis of the light-emitting; and a connecting pipe formed in a substantially tubular shape, attached to the casing, extending in an opposite direction of the light-emitting device, and being configured to transmit the light transmitted from the light-emitting window along the optical axis of the light-emitting device toward the wavelength converting module.

In addition, the wavelength converting module can include: a wavelength converting layer having a top surface including a phosphor layer, a light-diffusing layer having a light-diffusing top surface and a light-diffusing bottom surface disposed underneath the phosphor layer, a dielectric layer having a dielectric outer circumference included on a dielectric bottom surface thereof and a reflective layer, the dielectric layer being located underneath the light-diffusing bottom surface of the light-diffusing layer, and the reflective layer located underneath the dielectric outer circumference of the dielectric layer in an opposite direction of the light-diffusing layer; a base having an opening passing through a mounting board and a flange thereof, the flange having a flange outer circumference located on a flange top surface in an opposite direction of the opening, and connecting to the connecting pipe of the light source module, the mounting board having a mounting top surface and a mounting outer side surface located in an opposite direction of the opening, and being located on the flange top surface of the flange, and wherein the optical axis of the light-emitting device passes through the opening of the base; a contact layer having a first contact layer and a second contact layer, the first contact layer disposed underneath the reflective layer of the wavelength converting layer, and the second contact layer disposed on the mounting top surface of the mounting board; a plurality of metallic bumps attached between the first contact layer and the second contact layer of the contact layer, and thereby attaching the wavelength converting layer to the base; a first frame formed in a substantially planar ring shape, attached to at least one of the second contact layer of the contact layer and the mounting top surface of the mounting board, a first inner surface of the first frame contacting with a wavelength converting outer side surface of the wavelength converting layer, and a first top surface of the first frame located between the light-diffusing top surface of the light-diffusing layer and the dielectric bottom surface of the dielectric layer; a second frame formed in a substantially planar ring shape, attached to the base, and a second inner surface of the second frame facing at least the wavelength converting outer surface of the wavelength converting layer; and a reflective layer disposed between the second inner surface of the second frame and at least the wavelength converting outer side surface.

In the above-described exemplary semiconductor light-emitting apparatus, the light source module can include a connecting guide including a optical fiber having a fiber connecter and a fiber end, formed in a substantially tubular shape, and attaching the optical fiber therein, and also the optical fiber attached to the casing by the fiber connecter and being configured to transmit the light emitted from the semiconductor light-emitting device toward the fiber end through the optical fiber, wherein the fiber end contacts with a middle portion of the dielectric bottom surface of the dielectric layer of the wavelength converting layer, instead of the connecting pipe described above.

In the above-described exemplary semiconductor light-emitting apparatuses, the second frame can be attached on the flange outer circumference of the flange so as to surround the first frame and the mounting board of the base, and also can be integrated with the first frame to improve a workability, etc. The light-emitting apparatus can further include a collecting lens attached in the light-emitting window of the casing so that a lens optical axis thereof substantially corresponds to the optical axis of the semiconductor light-emitting device, and also can further include a light-absorbing layer disposed in the reflective top surface of the reflective layer to enhance optical characteristics.

In addition, the semiconductor light-emitting device can include at least one blue light-emitting chip and the phosphor layer can be selected from the group consisting of a yellow phosphor, and two phosphors including a red phosphor layer and a green phosphor layer, and also can include at least one ultraviolet light-emitting chip and the phosphor layer can contain at least one of a red phosphor layer, a green phosphor layer and a blue phosphor so that light-emitting apparatus emits various color lights, moreover, can include at least one blue laser chip and the phosphor layer can be an yttrium aluminum garnet phosphor ceramic so that light-emitting apparatus emits high-intensity light having a substantially white color light. In these cases, the semiconductor light-emitting device can be configured with a To-Can-typed semiconductor light-emitting device to realize a simple structure.

According to the above-described exemplary semiconductor light-emitting apparatus, the apparatus can realize a high thermal resistance, a high radiation performance and the like by attaching the wavelength converting layer on the mounting board via the metallic bumps. Thus, the disclosed subject matter can provide reliable semiconductor light-emitting apparatuses having a high thermal resistance that can emit various color lights including a substantially white color light having favorable optical characteristics, which can be used for a vehicle lamp and the like, and which can also include an optical fiber.

Another aspect of the disclosed subject matter includes vehicle headlights using the above-described semiconductor light-emitting apparatus. An exemplary vehicle headlight can include only a projector lens having an optical axis and at least one focus located on the optical axis thereof, and the semiconductor light-emitting apparatus including a mask on the light-emitting surface thereof, which is located near the focus of the projector lens so that the optical axis of the semiconductor light-emitting device corresponds substantially to the optical axis of the projector lens.

According to the exemplary vehicle headlight, the disclosed subject matter can provide vehicle headlights using the semiconductor light-emitting apparatus with a simple structure, which can form a light distribution pattern including a horizontal cut-off line having a high contrast by enlarging a light distribution pattern including a light-emitting line having a high contrast emitted from the light-emitting surface of the apparatus using the projector lens. Thus, the disclosed subject matter provides vehicle headlights using the reliable semiconductor light-emitting apparatuses, which can provide a favorable light distribution pattern, even when the semiconductor light-emitting apparatuses have been emitted for a long time in a small sealed housing.

BRIEF DESCRIPTION OF THE DRAWINGS

These and other characteristics and features of the disclosed subject matter will become clear from the following description with reference to the accompanying drawings, wherein:

FIGS. 4a and 4b are explanatory drawings showing connecting portions of wavelength converting layers in an exemplary embodiment and a comparative embodiment to evaluate thermal and optical characteristics of the semiconductor light-emitting apparatus of FIG. 1;

FIG. 5b is an enlarged side cross-sectional view showing an exemplary embodiment of a wavelength converting module of the semiconductor light-emitting apparatus shown in FIG. 5a;

FIG. 7b is an enlarged top view depicting an exemplary variation of a top surface of a wavelength converting layer of the semiconductor light-emitting apparatus of the headlight of FIG. 7a;

DETAILED DESCRIPTION OF EXEMPLARY EMBODIMENTS

Figure 2A:
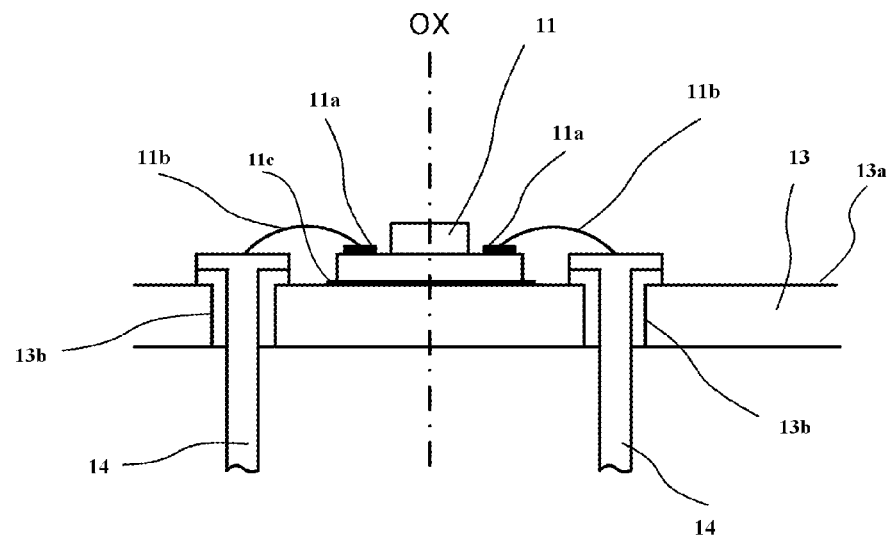
FIGS. 2a and 2b are a partial side cross-sectional view and a partial top view depicting an exemplary mounting method of a semiconductor light-emitting device, which is used as a light source for the semiconductor light-emitting apparatus of FIG. 1, respectively.

Exemplary embodiments and manufacturing methods of the disclosed subject matter will now be described in detail with reference to FIG. 1 to FIG. 8b, in which the same or corresponding elements use the same reference marks. FIG. 1a is a schematic enlarged side cross-sectional view showing a first exemplary embodiment of a semiconductor light-emitting apparatus made in accordance with principles of the disclosed subject matter.

The semiconductor light-emitting apparatus 10 can include a light source module 1 including a semiconductor light-emitting device 11 having an optical axis OX and a wavelength converting module 2 including a wavelength converting layer 3, in which a part of light emitted from the light-emitting device 11 is converted into light having a different wavelength by the wavelength converting layer 3 and in which a mixture light including the light having the different wavelength mixed with the light emitted directly from the light-emitting device 11 is emitted so as to be able to emit the mixture light having a desired color tone. The semiconductor light-emitting apparatus 10 can also emit a desired color light including a substantially white colored light by wavelength-converting substantially all lights emitted from the semiconductor light-emitting device 11 using the wavelength converting layer 3.

The light source module 1 can include a Transistor Outlined Can-typed (To-Can-typed) semiconductor light-emitting device, which can include: a stem 13 having a top surface 13a and through holes 13b (described in FIG. 2a) made from a metallic plate (e.g., stainless steel) such as an alloyed material based upon Iron (Fe), and formed in a substantially planar shape, the top surface 13a of the stem 13 including an outer circumference 13c; and a metallic cap 19 having a top plate including a light-emitting window 19a, made from a metallic plate (e.g., stainless steel) such as an alloyed material based upon Iron (Fe), formed in a substantially dome shape, the light-emitting window 19a being made of a transparent material such as a glass, a transparent resin, a lens made from a glass or a transparent resin, and sealed between the light-emitting window 19a and the metallic cap 19 using a sealing method such as a thermal adhesion, an adhesive joining, a swage and the like, the metallic cap 19 being attached on the top surface 13a of the stem 13 so that the outer circumference 13c of the top surface 13a of the stem 13 is exposed from the metallic cap 13.

The To-Can-typed semiconductor light-emitting device can also include; the semiconductor light-emitting chip 11 mounted on the top surface 13a of the stem 13; external terminals 14 connecting electrodes of the semiconductor light-emitting device 11 to an external power supply; and the metallic cap 19 having the light-emitting window 19a to transmit light emitted from the semiconductor light-emitting device 11, and the metallic cap 19 sealing the semiconductor light-emitting device 11 along with the stem 13.

The light source module 1 including the To-Can-typed semiconductor light-emitting device can include: a casing 15 having a light-emitting window 15W and a collecting lens 12, made from a metallic plate (e.g., stainless steel) such as an alloyed material based upon Iron (Fe), formed in a substantially dome shape, the casing 15 attaching the collecting lens 12 in the light-emitting window 15W and being attached to the outer circumference 13c of the top surface 13a of the stem 13, the collecting lens 12 (e.g., an aspheric convex lens) focusing the light emitted from the semiconductor light-emitting device 11 toward an opening 43 of a base 4 of the wavelength converting module 2 (described later); and a connecting pipe 16 made from a metallic plate (e.g., stainless steel) such as an alloyed material based upon Iron (Fe), formed in a substantially tubular shape, attached to the top surface 15a of the casing 15, and extending in a light-emitting direction of the semiconductor light-emitting device 11.

In this case, a thermal interface material (TIM) layer 15b can be disposed at least one of between the casing 15 and the outer circumference 13c of the top surface 13a of the stem 13 and between the casing 15 and the metallic cap 19 to enable the casing 5 to enlarge a tolerance of a contact surface with the top surface 13a of the stem 13 and so as to enable the casing 5 to efficiently radiate a heat generated from the semiconductor, and a thermal conductive elastic member 15c can be disposed between the casing 15 and the metallic cap 19, which extends in the light-emitting direction of the semiconductor light-emitting device 11, so as to enable the casing 5 to further efficiently radiate the heat generated from the semiconductor light-emitting device 11.

The TIM layer 15b and the thermal conductive elastic member 15c are disclosed in Patent document No. 2, which is owned by Applicant of this disclosed subject matter. Accordingly, derails of the TIM layer 15b and the thermal conductive elastic member 15c are abbreviated here. Additionally, the light source module 1 need not necessarily to include the To-Can-typed semiconductor light-emitting device by eliminating the metallic cap 19 and the thermal conductive elastic member 15c and by mounting the semiconductor light-emitting device 11 and the casing 15 on the top surface 13a of the stem 13 without the metallic cap 19.

The semiconductor light-emitting device 11 will now be described with reference to FIGS. 2a and 2b, which are a partial side cross-sectional view and a partial top view depicting exemplary mounting method of the semiconductor light-emitting device 11, which can be used as a light source for the semiconductor light-emitting apparatus 10 of FIG. 1, respectively. The semiconductor light-emitting device 11 may modify a semiconductor light source device, which is disclosed in Patent document No. 3 that is owned by Applicant of this disclosed subject matter.

Especially, electrodes of the semiconductor light source device and associated portions can be modified to suit needs for the semiconductor light-emitting apparatus 10. Specifically, the semiconductor light-emitting device 11 can be mounted on the top surface 13a of the stem 13 via an isolating thermal conductive adhesive material 11c such as an acrylic adhesive film, etc. Each of the electrodes 11a of the semiconductor light-emitting device 11 can be connected to a respective one of the external terminals 14, which are hermetically sealed in a respective one of the through holes 13b of the stem 13 to be isolated from the stem 13 using a field through (dielectric material) that is composed of a glass, a ceramic and the like, via a respect one of bonding wires 11b.

In this case, a semiconductor light-emitting chip 11e included in the light-emitting device 11 can directly be mounted on the top surface 13a of the stem 13 via an isolating thermal conductive adhesive material 11c such as an acrylic adhesive film and the like, and also each of electrodes of the semiconductor light-emitting chip 11 can be directly connected to a respective one of the external terminals 14, which are isolated between the external terminal 14 and the stem 13 using the through holes 13b in the stem 13. In either case, the semiconductor light-emitting chip 11e can be emitted by providing a power supply via the external terminals 14.

The semiconductor light-emitting chip 11e can be a blue laser chip(s) having a peak wavelength of approximately 400 to 460 nanometers, for example, which is configured with InGaN series material, and also can be a blue LED chip(s) having a peak wavelength of approximately 440 to 470 nanometers, which can emit blue light. Additionally, as the semiconductor light-emitting chip 11e, an LED of InGaN series that emits near-ultraviolet light having a light-emitting wavelength of approximately 380 nanometers can be used, and also a laser diode that emits ultraviolet light can also be used.

In these cases, the above-described wavelength converting layer 3 can include at least one of a yellow phosphor, a red phosphor, a green phosphor and a red phosphor. As the yellow phosphor, $Y_3Al_5O_{12}:Ce^{3+}$ (YAG), $(Sr, Ba)_2SiO_4:Eu^{2+}$, $Ca_x(Si, Al)_{12}(O, N)_{16}:Eu^{2+}$ and the like can be used. $CaAlSiN_3:Eu^{2+}$, $Ca_2Si_5N_8:Eu^{2+}$, $La_2O_2S:Eu^{3+}$, $KSiF_6:Mn^{4+}$, $KTiF_6:Mn^{4+}$ and the like can be used as the red phosphor, and $(Si, Al)_6(O, N):Eu^{2+}$, $BaMgAl_{10}O_{17}:Eu^{2+} Mn^{2+}$, $(Ba, Sr)_2SiO_4:Eu^{2+}$ and the like can be used as the green phosphor. Additionally, as the blue phosphor, $(Sr, Ca, Ba, Mg)_{10}(PO_4)_6C_{12}:Eu^{2+}$, $BaMgAl_{10}O_{17}:Eu^{2+}$, $LaAl(Si, Al)_6(N, O)_{10}:Ce^{3+}$ and the like can be used.

For example, when the wavelength converting layer 3 includes a resin layer that is made by mixing a yellow phosphor such as YAG with a transparent resin such as a silicone resin and when the semiconductor light-emitting chip 11e is a blue LED chip emitting blue light, the yellow phosphor can emit a yellow light upon being excited by blue light emitted from the blue LED chip. Accordingly, the semiconductor light-emitting apparatus 10 can emit substantially white light by an additive color mixture of the excited yellow light emitted from the yellow phosphor and a part of the blue light emitted from the blue LED chip.

In place of the yellow phosphor, when the red phosphor wavelength-converts the blue light emitted from the blue LED chip into red-purple light and the green phosphor wavelength-converts the blue light into blue-green light, the semiconductor light-emitting apparatus 10 can also emit light having substantially white light by an additive color mixture of the red-purple light emitted from the red phosphor that is excited by the blue light, the blue-green light emitted from the green phosphor that is excited by the blue light and a part of the blue light.

In addition, when the semiconductor light-emitting chip 11c is an LED of InGaN series that emits near-ultraviolet light having a wavelength of approximately 380 nanometers, a laser diode that emits ultraviolet light and the like, and when the wavelength converting layer 3 includes at least one of the red phosphor wavelength-converting the ultraviolet light into red light, the green phosphor wavelength-converting the ultraviolet light into green light and the blue phosphor wavelength-converting the ultraviolet light into blue light, the semiconductor light-emitting apparatus 10 can emit various colored lights including a substantially white light by an additive color mixture in accordance with a ratio of the above-described three color phosphors.

An exemplary basic structure of the wavelength converting module 2 will now be described in detail to return to FIG. 1. The wavelength converting module 2 can include: a base 4 having a flange 42, a mounting board 41 and an opening 43, the mounting board 41 having a top surface 41a, an outer side surface 41b and an outer circumference 41c located at a peripheral portion on the top surface 41a, made of the ceramic such as an aluminum nitride, an aluminum oxide and the like or the metallic plate such as aluminum, nickel, stainless steel and the like, the flange 42 made of a metallic plate such as aluminum, nickel, stainless steel and the like or a ceramic such as an aluminum nitride, an aluminum oxide, etc., and being attached to the connecting pipe of the light source module 1; a first frame 7 made of a resin having a thixotropy, a glass material and the like, formed in a substantially planar ring shape, and attached on the outer circumference 41c on the top surface 41a of the mounting board 41; a second frame 8 made of a resin having a thixotropy, a metallic material and the like, formed in a substantially planar ring shape, attached on the outer circumference 42c of the top surface 42a of the flange 42, and surrounding the first frame 7 and the mounting board 41 of the base 4; the wavelength converting layer 3 having a top surface 3a and an outer side surface 3b being mounted on the top surface 41a of the mounting board 41 via metallic bumps 5; and a reflective material 9 made by dispersing a transparent diffuser into a transparent material such as a silicone resin, an epoxy resin, a glass material and the like, and being disposed at least between the outer side surface 3b of the wavelength converting layer 3 exposed from the first frame 7 and the second frame 8 while being prevented flowing toward a bottom surface of the wavelength converting layer 3.

Figure 3A:
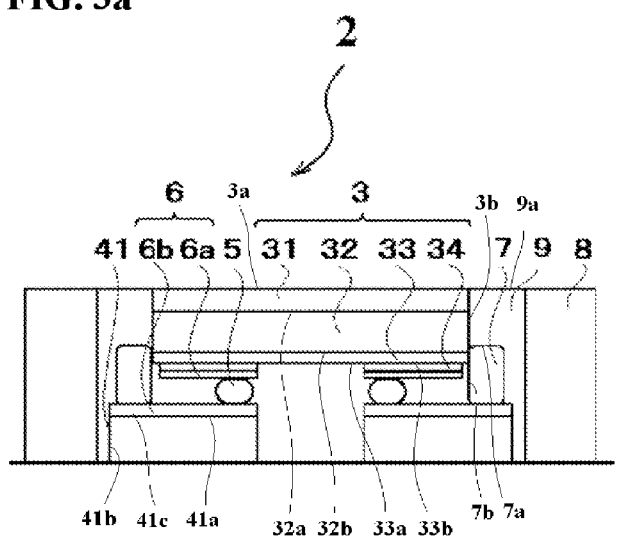
FIG. 3a is an enlarged side cross-sectional view showing an exemplary embodiment of a wavelength converting module of the semiconductor light-emitting apparatus shown in FIG. 1.
Figure 3B:
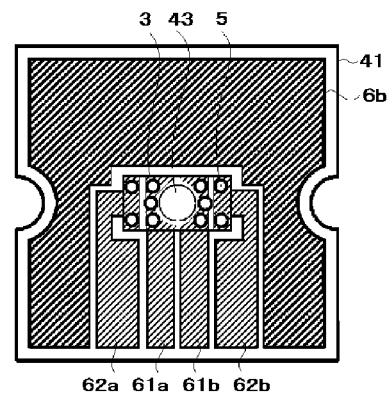
FIG. 3b is an explanatory top view for an exemplary location of metallic bumps shown in FIG. 3a, FIG. 3c is an explanatory view in an opposite direction of a wavelength converting layer for the exemplary location of the metallic bumps of FIG. 3b, and FIG. 3d-1 and FIG. 3d-2 are explanatory side views depicting exemplary un-melted metallic bumps, respectively.
Figure 3C:
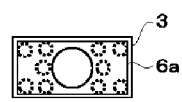
Figures 1, 2, 3D:
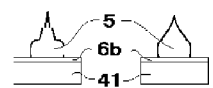
FIG. 1 is a schematic enlarged side cross-sectional view showing a first exemplary embodiment of a semiconductor light-emitting apparatus made in accordance with principles of the disclosed subject matter.

Next, an exemplary more specific structure of the wavelength converting layer 3 and associated elements will now be described in detail with reference to FIG. 3a to FIG. 3c, wherein FIG. 3a is an enlarged side cross-sectional view showing an exemplary embodiment of the wavelength converting module 2, FIG. 3b is an explanatory top view for an exemplary location of the metallic bumps 5, and FIG. 3c is an explanatory view in an opposite direction of the wavelength converting layer 3 for the exemplary location of the metallic bumps of FIG. 3b.

The wavelength converting layer 3 can include: a phosphor layer 31 (described in detail later); a light-diffusing layer 32 having a top surface 32a and a bottom surface 32b made from aluminum oxide of a polycrystalline state and disposed underneath the phosphor layer 31; a dielectric layer 33 having a bottom surface 33a and an outer circumference 33b included on the dielectric bottom surface (33a), made by alternate-forming SiO$_2$ and TiO$_2$ and disposed underneath the bottom surface 32b of the light-diffusing layer 32; a reflective layer 34 made of a metallic layer such as aluminum and the like having a reflectivity of 85 percentages or more and disposed underneath the outer circumference 33b of the dielectric layer 33 so as not to directly reflect the light emitted from the semiconductor light-emitting device 11; and a first contact layer 6a of a contact layer 6 made by laminating Ti having a thickness of approximately 0.06 micrometers, Pt having a thickness of approximately 0.2 micrometers and Au having a thickness of approximately 1.0 micrometers from a direction of the reflective layer 34 and being formed underneath the reflective layer 34.

On the top surface 41a of the mounting board 41 of the base 4, which mounts the wavelength converting layer 3 on the mounting board 41, a second contact layer 6b of the contact layer 6, which is made by laminating Ti having a thickness of approximately 0.06 micrometers, Pt having a thickness of approximately 0.2 micrometers and Au having a thickness of approximately 1.0 micrometers from a direction of the mounting board 41, can be disposed. The wavelength converting layer 3 can be mounted on the mounting board 41 of the base 4 via the metallic bumps 5, which is located between the first contact layer 6a of the wavelength converting layer 3 and the second contact layer 6b of the mounting board 41 of the base 4.

The metallic bumps 5 can be a metallic such as gold (Au), aluminum (Al), copper (Cu), silver (Ag), nickel (Ni) and the like, a solder such as Sn—Ag, and an alloy such as Au—Sn, etc. As each shape of the metallic bumps 5, a ball-shaped metal, which is made by melting an end of one of the above materials can be used, and a sintered material of metallic particle (e.g., Au particle, Ag particle, etc.) can be used.

In addition, the metallic bumps 5, which are located on the second contact layer 6b of the contact layer 6, can be electrically divided by forming conductive circuit patterns 61a, 61b, 62a and 62b as shown in FIG. 3b. By measuring each of impedances between respective two of the conductive circuit patterns 61a to 62b and/or by measuring each of impedances between each of the conductive circuit patterns 61a to 62b and the first contact layer 6a of the contact layer 6, which is located toward the wavelength converting layer 3 as shown in FIG. 3c, failures such as a crack of the metallic bumps 5 can be detected.

Moreover, FIG. 3d-1 and FIG. 3d-2 are explanatory side views depicting exemplary un-melted metallic bumps, respectively. When the wavelength converting layer 3 is attached to the mounting board 41 of the base 4, the wavelength converting layer 3 can be placed on the mounting board 41 via un-melted metallic bumps, and can be attached on the mounting board 41 via the metallic bumps 5 by melting the un-melted metallic bumps and by a thermal compressive bond, which is described in detail later. Each of the metallic bumps 5 can be solidified into a substantially ovoid shape having a height of approximately 20 micrometers and a width of approximately 75 micrometers between the first contact layer 6a and the second contact layer 6b of the contact layer 6 so that each of contacting surfaces between the metallic bumps 5 and each of the first and second contact layers 6a and 6b of the contact layer 6 is wider.

As the phosphor layer 31, a YAG phosphor ceramic, which is made by press-sintering a phosphor material dispersing the YAG phosphor into aluminum oxide, can be used. When the blue LED chip, which emits a blue laser excitation light, is used as a light source for the semiconductor light-emitting device 11, the semiconductor light-emitting apparatus 10 can emit white light having a substantially daylight color tone by an additive color mixture of the excited yellow light emitted from the YAG phosphor ceramic of the yellow phosphor and a part of the blue laser light emitted from the blue LED chip, and therefore can be used as a light source having a high visibility for a vehicle headlight.

The wavelength converting layer 3 described above can be formed in a large shape, which is able to be removed in multiple pieces, and can be formed in a substantially rectangular shape having a height of an approximately 0.4 millimeters and a width of an approximately 0.8 millimeters by cutting (singulating) the large shape with a dying blade. The top surface 3a of the wavelength converting layer 3 cannot be limited to the above-described rectangular shape, which can match a light distribution pattern projected from a headlight as a light source for the headlight, but can also be formed in various shapes such as a rectangular shape, a circular shape and the like, which can match each of light distributions in accordance with various usages.

Next, exemplary methods for manufacturing the semiconductor light-emitting apparatus 10 described above will now be described.

Process 1 (Process for forming wavelength converting layers) is preparing the YAG phosphor ceramic, which is made by press-sintering the phosphor material dispersing the YAG phosphor into aluminum oxide, as the phosphor layer 31, forming the light-diffusing layer 32 made from aluminum oxide of a polycrystalline state (poly crystal $Al_2O_3$) on a surface of the phosphor layer 31, forming the dielectric layer 33 made by alternate-forming $SiO_2$ and $TiO_2$ on the bottom surface 32b of the light-diffusing layer 32 in an opposite direction of the phosphor layer 31 by a spatter method, forming the reflective layer 34 made of the aluminum on the outer circumference 33b of the dielectric layer 33 by the spatter method, forming the first contact layer 6a made by laminating Ti, Pt and Au on the reflective layer 34 by the spatter method, and forming the above-described wavelength converting layer in the substantially rectangular shape having the height of an approximately 0.4 millimeters and the width of an approximately 0.8 millimeters by cutting (singulating) the large shape with the dying blade.

Process 2 (Process for forming the base 4) is preparing the mounting board 41 of the base 4, which is made from the aluminum nitride, forming the second contact layer 6b of the contact layer 6 on the mounting board 41 of the base 4 by laminating Ti having the thickness of approximately 0.06 micrometers, Pt having the thickness of approximately 0.2 micrometers and Au having the thickness of approximately 1.0 micrometers from a direction of the mounting board 41 using the spatter method, and mounting the un-melted metallic bumps on the second contact layer 6b of the contact layer 6.

In the above-described manufacturing process for the un-melted metallic bumps, ball-shaped bumps having a substantially diameter of 30 micrometers can be formed by a wire bonding machine, in which an end of gold wire through a capillary is formed in the ball shape, said ball-shaped bump can be attached on the second contact layer 6b by dropping the capillary and by pressing the bump on the second contact layer 6b, and the gold wire connecting the bump can be cut after lifting the capillary, and can be attached on the second contact layer 6b by a solid-phase diffusion of metals between the second contact layer 6b and un-melted metallic bumps.

With respect to each shape of the un-melted metallic bumps, a continuous smooth shape as shown in FIG. 3d-2 may be preferable to a stepped shape as shown in FIG. 3d-1 because the continuous smooth shape may enable the un-melted metallic bumps to enlarge the contact surface with the first contact layer 6a as described in Process for attaching the wavelength converting layer 3 next.

Process 3 (Process for attaching the wavelength converting layer 3) is placing the wavelength converting layer 3 on the un-melted metallic bumps, attaching the wavelength converting layer 3 to the mounting board 41 via the un-melted metallic bumps between the first contact layer 6a and the second contact layer 6b by thermal compression bonding the metallic bumps using a supersonic vibration method and melting the un-melted metallic bumps and by a solid-phase diffusion of metals between the second contact layer 6b and melted metallic bumps 5, and attaching the mounting board 41 mounting the wavelength converting layer 3 to the flange 42 made from aluminum of the base 4 via a silicon adhesive material including Ag filler.

In this case, when each of the un-melted metallic bumps is formed in the continuous smooth shape as shown in FIG. 3d-2, because each of the contact surfaces of the bumps 5 with the second contact layer 6b can be formed in a wide smooth contacting shape from each top of the bumps 5, a contacting intensity between the metallic bumps 5 and the second contact layer 6b can improve and therefore, the wide contacting shape can efficiently radiate heat generated from the wavelength converting layer 3 toward the base 4.

Process 4 (Process for forming the reflective layer in the wavelength converting layer) is applying the first frame 7, which is made by mixing titanium dioxide particle having a reflectivity with a silicone resin having thixotropy, to the mounting board 41 of the base 4 so that the first frame 7 having a height of approximately 200 micrometers contacts with the outer side surface 3b of the wavelength converting layer 3 at a position, which is lower than the phosphor layer 31, by a constant discharge apparatus, and therefore sealing a space between the mounting board 41 and the wavelength converting layer 3 by the first frame 7, forming the second frame 8 having a height of approximately 880 micrometers, which is made from the silicone resin having thixotropy, on the outer circumference 42c of the top surface 42a of the flange 42 so that a top surface of the second frame 8 becomes a substantially same level as the top surface 3a of the wavelength converting layer 3, filling an uncured silicon resin including Titanium oxide as a reflective material between the first frame 7 and the side surface 3b of the wavelength converting layer 3 and the second frame 8, and forming the reflective layer 9 between the first frame 7 and the side surface 3b of the wavelength converting layer 3 and the second frame 8 by solidifying the uncured silicon resin.

Process 5 (Process for connecting the wavelength converting module 2 to the light source module 1) is arranging the connecting pipe 16 made of aluminum and formed in a substantially tubular shape at the casing 15 of the light source module 1 by using an optical-centric bonding station and connecting them with a welding method, inserting the flange 42 of the wavelength converting module 2 into the connecting pipe 16 in an opposite direction of the light source module 1, attaching the flange 42 to the connecting pipe 16 via a silicone adhesive material including Ag filler, and finishing the semiconductor light-emitting apparatus 10.

Here, thermal characteristics and optical characteristics of the light-emitting apparatus 10 will now be described with reference to FIGS. 4a and 4b. An exemplary embodiment shown in FIG. 4a includes the wavelength converting layer 3, the metallic bumps 5 and the mounting board 41, but does not include the first frame 7, the second frame 8 and the reflective material layer 9. A comparative embodiment includes a silicon adhesive material between the first contact layer 6a and the mounting board 41 instead of the metallic bumps 5 of the exemplary embodiment.

Each of thermal resistances of the exemplary embodiment and the comparative embodiment was 46 degrees centigrade/watt and 116 degrees centigrade/watt, respectively. Accordingly, the thermal resistance of the semiconductor light-emitting apparatus 10 can extremely reduce because of the connecting method using the metallic bumps 5 as compared with a conventional connecting method using the silicone adhesive material, etc. Next, each of surface temperatures of the phosphor layers 31 of the exemplary embodiment and the comparative embodiment was measured while each of surface temperatures of the phosphor layers 31 maintains at 85 degrees centigrade and a blue laser light having 1.6 watts is emitted into each of the wavelength converting layers 3. When each of the surface temperatures of the phosphor layers 31 of the exemplary embodiment and the comparative embodiment increases and when each of the surface temperatures saturated, each of the surface temperatures of the phosphor layers 31 of the exemplary embodiment and the comparative embodiment was 122 degrees centigrade and 178 degrees centigrade, respectively.

Therefore, the surface temperature of the phosphor layer 31 of the semiconductor light-emitting apparatus 10 also can be extremely inhibited because of the connecting method using the metallic bumps 5 as compared with the conventional connecting method using the silicone adhesive material, etc. Additionally, each of light-emitting efficiencies of the embodiment and the comparative embodiment at a room temperature of 25 degrees centigrade was searched while each of bottom surface temperatures of the mounting boards 41 maintains at 85 degrees centigrade and the blue laser light having 1.6 watts is emitted into each of the wavelength converting layers 3. As a result, each of light-emitting efficiencies of the embodiment and the comparative embodiment at a room temperature of 25 degrees centigrade and at each saturation temperature of the embodiment and the comparative embodiment was 88 percentages and 67 percentages, respectively. Consequently, the light-emitting efficiency of the semiconductor light-emitting apparatus 10 can also improve because of the connecting method using the metallic bumps 5.

Thus, thermal characteristics and optical characteristics of the semiconductor light-emitting apparatus 10 of the disclosed subject matter can extremely improve by employing the connecting method using the metallic bumps 5. Accordingly, as described with reference to FIG. 7b later, because a mask 3M such as a black metallic plate, a reflective metallic plate and the like can be located on the top surface 3a of the wavelength converting layer 3, the semiconductor light-emitting apparatus 10 of the disclosed subject matter can vary a light-emitting shape of the top surface 3a so as to be able to collaborate effectively with a usage thereof. When the mask 3M is the reflective metallic plate, because light reflected by the mask 3M can return toward the reflective layer 34, the semiconductor light-emitting apparatus 10A can efficiently emit the mixture light from the top surface 3a, which is a light-emitting surface of the semiconductor light-emitting apparatus 10A.

In addition, as described with reference to FIG. 8b later, a light-absorbing layer 3C can be disposed in a top surface 9a of the reflective layer 9 and configured as a light-shielding material. The top surface of the light-absorbing layer 3C can be configured to be substantially at a same level as (or co-planar with, or continuous with) the top surface 3a of the wavelength converting layer 3. Thereby, the semiconductor light-emitting apparatus 10B can emit the mixture light having a high contrast between a light-emitting surface (3a) and a non-light-emitting surface (3C). The light-absorbing layer 3C is disclosed in Patent document No. 4 by inventors of this disclosed subject matter. Accordingly, details of the light-absorbing layer 3C are abbreviated here.

Figure 5A:
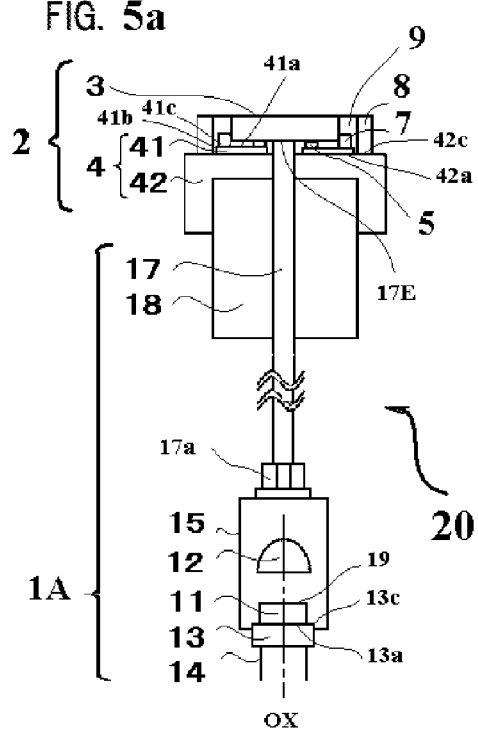
FIG. 5a is a schematic enlarged side cross-sectional view showing a second exemplary embodiment of the semiconductor light-emitting apparatus made in accordance with principles of the disclosed subject matter.
Figure 5B:
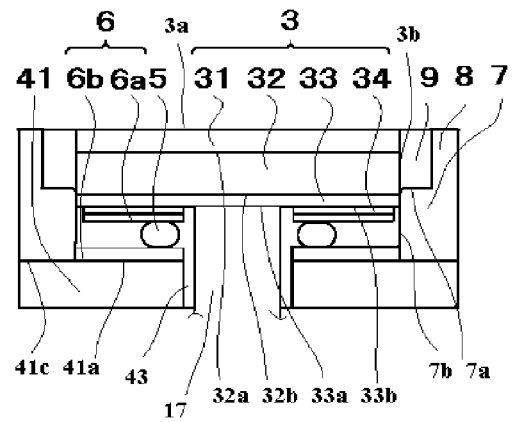

A second exemplary embodiment of the semiconductor light-emitting apparatus of the disclosed subject matter will now be described with reference to FIGS. 5a and 5b. FIG. 5a is a schematic enlarged side cross-sectional view showing the second exemplary embodiment of the semiconductor light-emitting apparatus made in accordance with principles of the disclosed subject matter, and FIG. 5b is an enlarged side cross-sectional view showing an exemplary embodiment of a wavelength converting module of the semiconductor light-emitting apparatus shown in FIG. 5a, wherein the exemplary embodiment of the wavelength converting module shows an exemplary variation of the wavelength converting module in the semiconductor light-emitting apparatus 10 of the first embodiment.

Figure 2B:
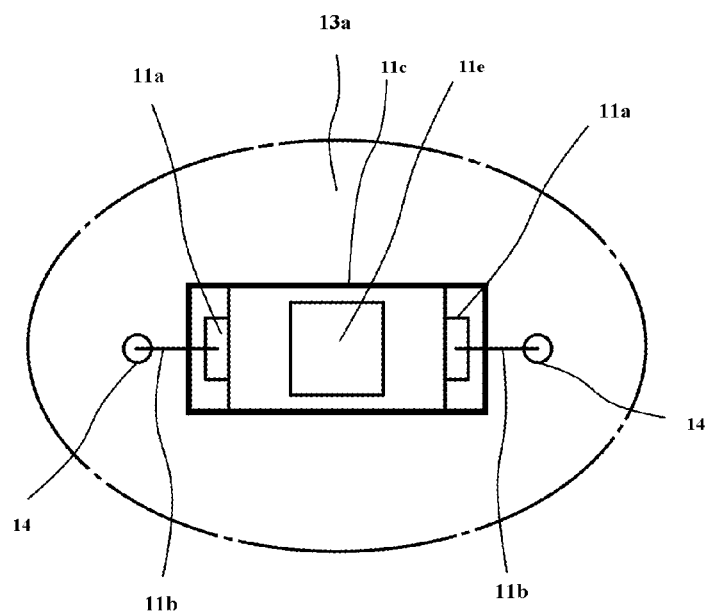

The light source module 1A can include the To-Can-typed semiconductor light-emitting device, which can include: the stem 13 having the top surface 13a and through holes 13b as described in FIG. 2a, the stem 13 made from the metallic plate (e.g., stainless steel) such as an alloyed material based upon Iron (Fe), and formed in a substantially planar shape, the top surface 13a of the stem 13 including the outer circumference 13c; and the metallic cap 19 having the top surface including the light-emitting window, made from a metallic plate (e.g., stainless steel) such as an alloyed material based upon Iron (Fe), formed in the substantially dome shape, the light-emitting window being made of a transparent material such as a glass, a transparent resin, a lens made from a glass or a transparent resin, and sealed between the light-emitting window and the metallic cap 19 using the sealing method such as a thermal adhesion, an adhesive joining, a swage and the like, the metallic cap 19 mounted on the top surface 13a of the stem 13 so that the outer circumference 13c of the top surface 13a of the stem 13 is exposed from the metallic cap 13 as described in the first embodiment.

The To-Can-typed semiconductor light-emitting device can also include; the semiconductor light-emitting chip 11 mounted on the top surface 13a of the stem 13; the external terminals 14 connecting electrodes of the semiconductor light-emitting device 11 to an external power supply; and the metallic cap 19 having the light-emitting window to transmit light emitted from the light-emitting device 11, and the metallic cap 19 sealing the semiconductor light-emitting device 11 along with the stem 13 in common with the first embodiment.

The light source module 1 including the To-Can-typed semiconductor light-emitting device can include: the casing 15 having the collecting lens 12, made from a metallic plate (e.g., stainless steel) such as an alloyed material based upon Iron (Fe), formed in a substantially tubular shape, the casing 15 attaching the collecting lens 12 therein and being attached to the outer circumference 13c of the top surface 13a of the stem 13, the collecting lens 12 (e.g., an aspheric convex lens) focusing the light emitted from the semiconductor light-emitting device 11; a optical fiber 17 having a fiber connector 17a and fiber end 17E configured to receive light focused by the collecting lens 12, the fiber connector 17a connecting the optical fiber 17 to the casing, and the fiber end 17E located at an end of the optical fiber 17 in an opposite direction of the fiber connector 17a; and a connecting pipe 18 made from a metallic plate (e.g., stainless steel) such as an alloyed material based upon Iron (Fe), formed in a substantially tubular shape to attach the optical fiber 17 therein via an adhesive material such as a silicone resin.

The semiconductor light-emitting device 11 having the optical axis OX can be mounted on the top surface 13a of the stem 13 via the isolating thermal conductive adhesive material 11c such as an acrylic adhesive film, etc. Each of the electrodes 11a of the semiconductor light-emitting device 11 can be connected to the respective one of the external terminals 14, which are hermetically sealed in a respective one of the through holes 13b of the stem 13 to be isolated from the stem 13 using a field through (dielectric material) that is composed of a glass, a ceramic and the like, via a respect one of bonding wires 11b as described with reference to FIGS. 2a and 2b in the first embodiment.

In this case, the semiconductor light-emitting chip 11e included in the light-emitting device 11 can directly be mounted on the top surface 13a of the stem 13 via the isolating thermal conductive adhesive material 11c such as an acrylic adhesive film and the like, and also each of electrodes of the semiconductor light-emitting chip 11 can be directly connected to the respective one of the external terminals 14, which are isolated between the external terminal 14 and the stem 13 using the through holes 13b in the stem 13. Additionally, the light source module 1 need not necessarily to include the To-Can-typed semiconductor light-emitting device by eliminating the metallic cap 19 and by mounting the semiconductor light-emitting chip 11e and the casing 15 on the top surface 13a of the stem 13 without the metallic cap 19. In either case, the semiconductor light-emitting chip 11e can be emitted by providing a power supply via the external terminals 14 in common with the first embodiment.

The semiconductor light-emitting chip 11e can be a blue laser chip(s) having a peak wavelength of approximately 400 to 460 nanometers, for example, which is configured with InGaN series material, and also can be a blue LED chip(s) having a peak wavelength of approximately 440 to 470 nanometers, which can emit blue light. Additionally, As the semiconductor light-emitting chip 11e, an LED of InGaN series that emits near-ultraviolet light having a light-emitting wavelength of approximately 380 nanometers can be used, and also a laser diode that emits ultraviolet light can also be used in common with the light source module 1.

In the second embodiment, by attaching the connecting pipe 18 into the flange 42 of the base 4 and by contacting the fiber end 17E of the optical fiber 17 with the wavelength converting layer 3, the wavelength converting layer 3 can receive light transmitted and emitted from the optical fiber 17. Therefore, the semiconductor light-emitting apparatus 20 can also emit a substantially same mixture light including the white light as the semiconductor light-emitting apparatus 10. In this case, the semiconductor light-emitting apparatus 20 can separate a light-emitting portion of the light source module 1A from the wavelength converting module 2 via the optical fiber 17, and therefore can minify the wavelength converting module 2 thereof.

Figure 7A:
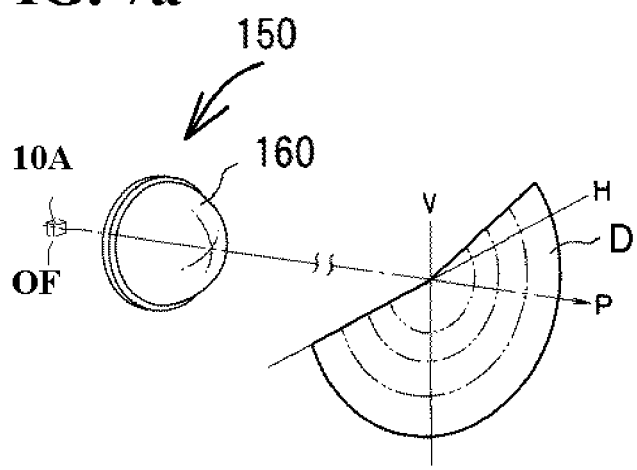
FIG. 7a is a schematic perspective view and a schematic diagram showing a light distribution pattern including a horizontal cut-off line formed by a second exemplary embodiment of a vehicle headlight.
Figure 7B:
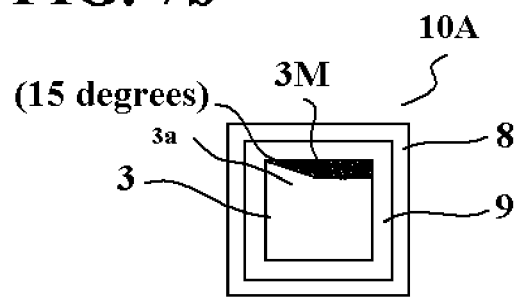

FIG. 7b shows an exemplary variation of the wavelength converting module 2 in the semiconductor light-emitting apparatus 10, which can be employed in the first embodiment and also in the second embodiment. The exemplary variation of the wavelength converting module 2 relates to the base 4. The first frame 7 and the second frame 8 can be mounted directly on the outer circumference 41c of the top surface 41a of the mounting board 41 located on the flange 42 of the base 4, in which the second contact layer 6b is not formed between the first and second frames 7 and 8 and the outer circumference 41c of the mounting board 41.

In addition, the second frame 8 can also be integrated with the first frame 7, and the reflective layer 9 can be disposed between the outer surface 3b of the wavelength converting layer 3 and the second frame 8, which is located on and over the top surface 7a of the first frame 7 as shown in FIG. 5b. Thereby, the number of parts and a manufacturing process can reduce, and also the reflective layer 9 need not be disposed between the first frame 7 and the second frame 8. In this case, the reflective layer 9 can contact with the outer surface 3b of the wavelength converting layer 3 in common with the embodiment of the wavelength converting module 2 shown in FIG. 3a. Accordingly, the semiconductor light-emitting apparatuses 10 and 20 using the exemplary variation of the wavelength converting module 2 can also provide a light distribution pattern having a high contrast between a light-emitting region and a non-light-emitting region.

As described above, the disclosed subject matter can provide reliable semiconductor light-emitting apparatus having a high thermal resistance and a high radiation performance by attaching the wavelength converting layer 3 on the mounting board 41 of the base 4 via the metallic bumps 5, which are located between the first contact layer 6a toward the wavelength converting layer 3 and the second contact layer 6b toward the mounting board 41. Accordingly, the semiconductor light-emitting apparatuses can emit the mixture light having various color tones including a substantially white color tone from a small light-emitting surface, which is the top surface 3a of the wavelength converting layer 3, even when a high-intensity laser chip is used as an excitation light source for the wavelength converting layer 3.

Figure 6:
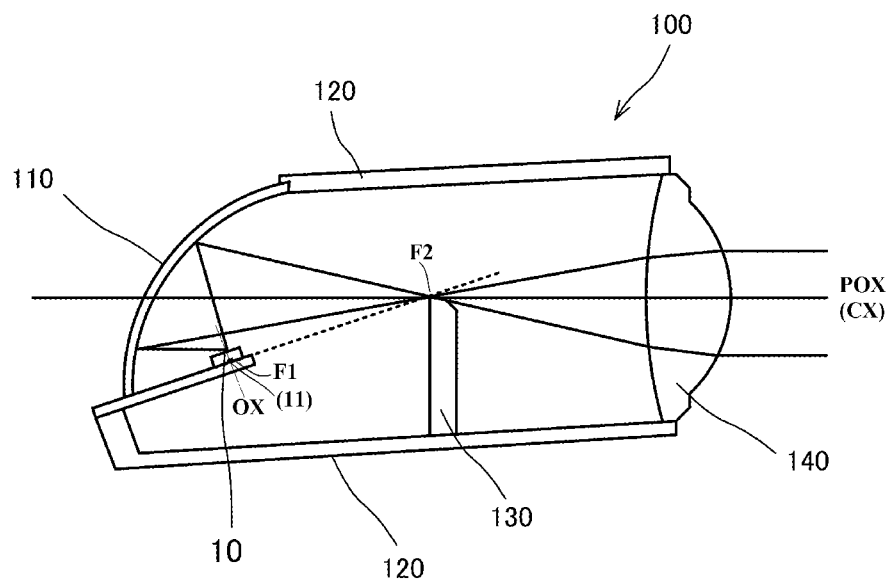
FIG. 6 is a schematic structural cross-sectional view depicting a first exemplary embodiment of a vehicle headlight using a semiconductor light-emitting apparatus made in accordance with principles of the disclosed subject matter.

Next, exemplary embodiments of a vehicle headlight using the semiconductor light-emitting apparatuses 10, 10A, 10B and 20 as a light source will now be described with reference to FIG. 6 to FIG. 8b. FIG. 6 is a schematic structural cross-sectional view showing a first exemplary embodiment of a vehicle headlight using a semiconductor light-emitting apparatus made in accordance with principles of the disclosed subject matter. The vehicle headlight 100 is an exemplary projector typed headlight for a low beam.

The vehicle headlight 100 can include: at least one ellipsoidal reflector 110 having a central axis CX, a first focus F1 and a second focus F2 located on the substantially central axis CX; the semiconductor light-emitting apparatus 10 having the optical axis OX located substantially at (i.e., at or almost at) the first focus F1 of the ellipsoidal reflector 110 so that the optical axis OX intersects with the central axis CX of the ellipsoidal reflector 110: a projector lens 140 having an optical axis PDX and at least one focus located toward the ellipsoidal reflector 110 on the optical axis PDX of the projector lens 140 so that the optical axis PDX thereof corresponds substantially to the central axis CX of the ellipsoidal reflector 110 and the focus thereof is located substantially at the second focus F2 of the ellipsoidal reflector 110; a shade 130 having a top surface located between the projector lens 140 and the ellipsoidal reflector 110 so that the top surface thereof is located substantially at the second focus F2 of the ellipsoidal reflector 110; and an housing 120 being located adjacent the projector lens 140 and the ellipsoidal reflector 110.

In this case, light emitted from the semiconductor light-emitting apparatus 10 can be reflected by the ellipsoidal reflector 110, and can be emitted in a direction toward a light-emission of the headlight 100 via the projector lens 140. The vehicle headlight 100 can shade an upward light which is reflected from the ellipsoidal reflector 110 and is directly emitted from the semiconductor light-emitting apparatus 10 toward the projector lens 230, and therefore can be used for a low beam headlight.

The vehicle headlight 100 can also be provided with the semiconductor light-emitting apparatus having a high reliability, which can be maintained at a high quality even when it has been used for a long time under harsh conditions, as described above. Thus, the first embodiment can also provide vehicle headlights having a high reliability even when the semiconductor light-emitting device 20 has been emitting light for a long time in the small sealed housing 120.

FIG. 7a is a schematic perspective view and a schematic diagram showing a light distribution pattern including a horizontal cut-off line formed by a second exemplary embodiment of a vehicle headlight using a semiconductor light-emitting apparatus made in accordance with principles of the disclosed subject matter, and FIG. 7b is an enlarged top view depicting an exemplary variation of a top surface of a wavelength converting layer of the semiconductor light-emitting apparatus of FIG. 7a. The second embodiment is another exemplary projector typed headlight for a low beam, and is an exemplary direct projector type headlight without a reflector.

The schematic diagram shows a light distribution pattern D including a horizontal cut-off line for a low beam with respect to a horizontal line H and a vertical line V, which is located substantially perpendicular to a road, and which is formed by the projector headlight 150. The projector headlight 150 shows only a projector lens 160 having an optical axis P and at least one focus OF located on the optical axis P thereof, and the semiconductor light-emitting apparatus 10A located near the focus of the projector lens 160 so that the optical axis OX of the semiconductor light-emitting device 11 corresponds substantially to the optical axis P of the projector lens 160, in order to facilitate an understanding of the projector headlight 150.

The light distribution pattern D including the horizontal cut-off line can be formed on a virtual vertical screen by the projector headlight 150 using the semiconductor light-emitting apparatus 10A. More specifically, light emitted from the semiconductor light-emitting apparatus 10A can be projected on the virtual vertical screen in reverse with respect to the vertical line V. Accordingly, as described above, by forming one side of the light-emitting surface of the semiconductor light-emitting apparatus 10 in a line including an elbow line (for example, having a angle of 15 degrees) such as the above-described horizontal cut-off line using the mask 3M, the light emitted from the semiconductor light-emitting apparatus 10A can form the light distribution pattern D via the projector lens 160.

In this case, the semiconductor light-emitting apparatus 10A can be used as a light source for a vehicle headlight including a low beam by enlarging a light distribution pattern emitted from the light-emitting surface (the top surface 3a) of the light-emitting apparatus 10A and by forming the light-emitting line having a higher contrast. In addition, the light distribution pattern can be formed in various shapes as described above. Therefore, the semiconductor light-emitting device 10A of the disclosed subject matter can be used as a light source for various vehicle lamps such as the headlight, a tail lamp, etc.

Figure 8A:
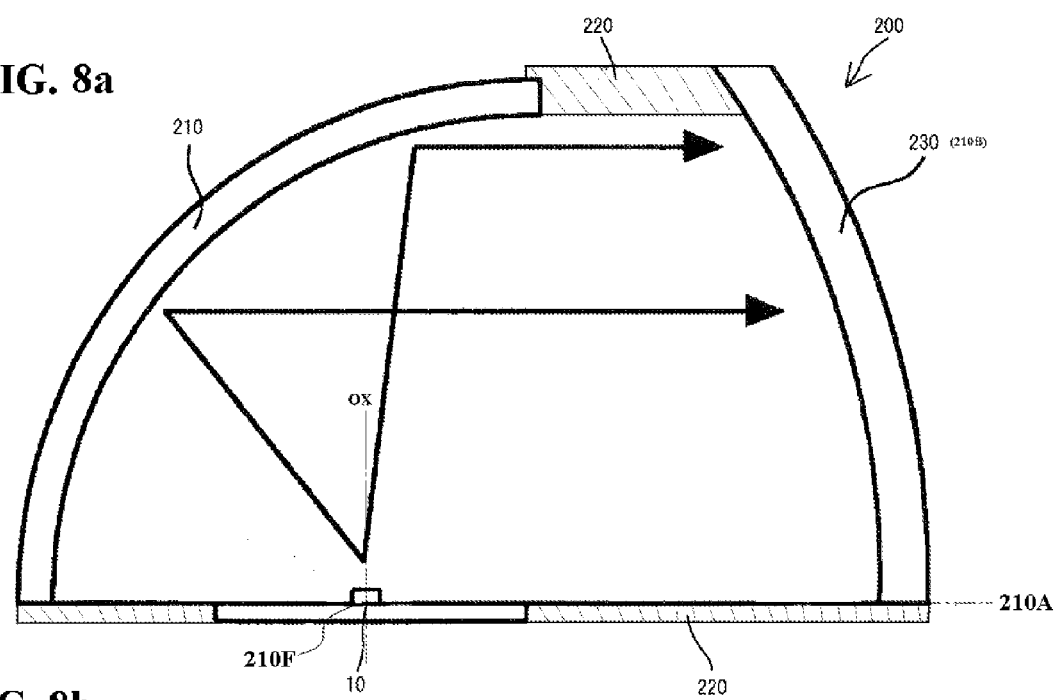
FIG. 8a is a schematic structural cross-sectional view depicting a third exemplary embodiment of a vehicle headlight.
Figure 8B:
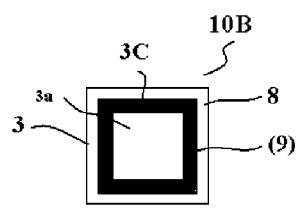
FIG. 8b is an enlarged top view depicting another exemplary variation of a top surface of a wavelength converting layer for the semiconductor light-emitting apparatus of the headlight of FIG. 8b.
Figure 9:
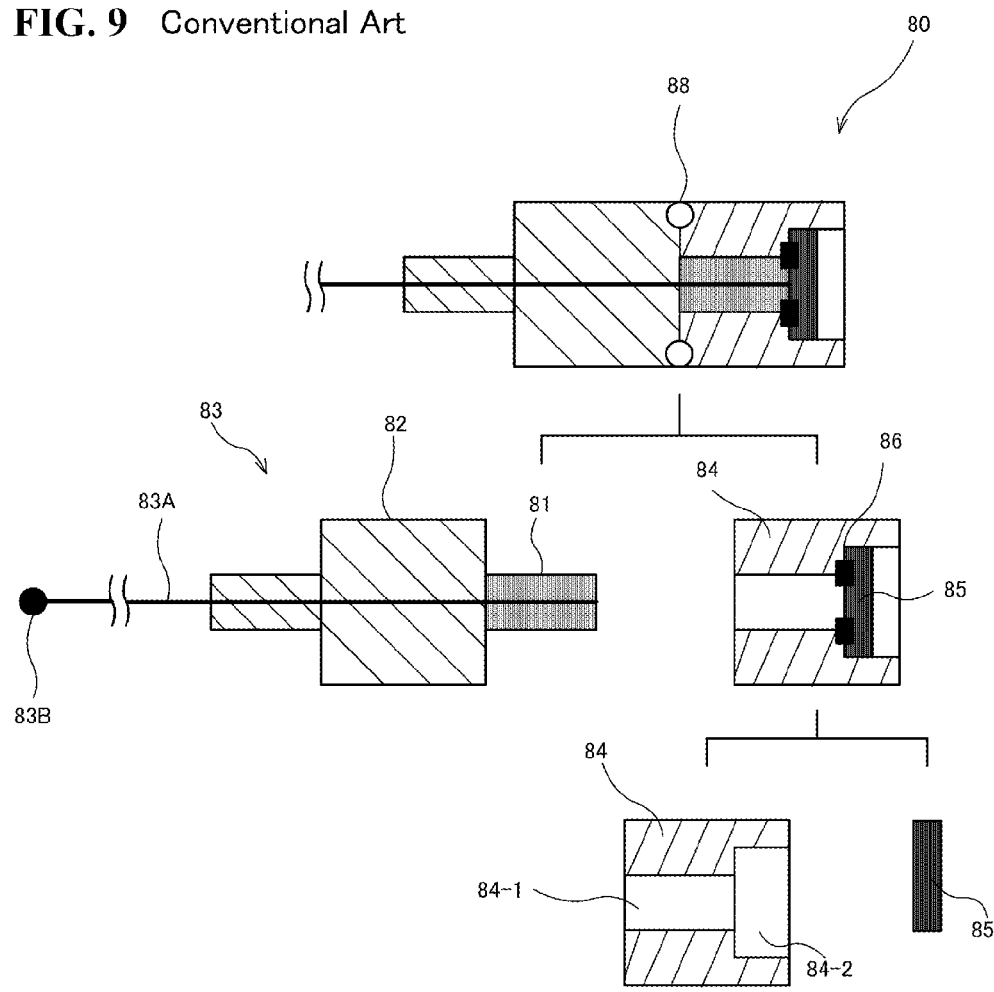
FIG. 9 is a schematic side cross-sectional view including partial side cross-sectional views showing a conventional semiconductor light-emitting device.

FIG. 8a is a schematic structural cross-sectional view depicting a third exemplary embodiment of a vehicle headlight, which is an exemplary reflector typed headlight, using a semiconductor light-emitting device made in accordance with principles of the disclosed subject matter, and FIG. 8b is an enlarged top view depicting another exemplary variation of a top surface of a wavelength converting layer for the semiconductor light-emitting apparatus of the headlight of FIG. 8b.

The vehicle headlight 200 can include: at least one revolved parabolic reflector 210 having a central axis 210A, a focus 210F located on the central axis 210A and an opening 210B; the semiconductor light-emitting apparatus 10 having the optical axis OX located substantially at (i.e., at or almost at) the focus 210F of the parabolic reflector 210 so that the optical axis OX thereof intersects with the central axis 210A of the parabolic reflector 210; an outer lens 230 being located at the opening 210B of the parabolic reflector 210 so as to cover the opening 210B of the parabolic reflector 210; and a housing 220 being located adjacent the parabolic reflector 210, the outer lens 230 and the semiconductor light-emitting apparatus 10.

According to the third embodiment, light emitted from the semiconductor light-emitting apparatus 10 can be reflected by the parabolic reflector 210, and can be emitted in a direction toward a light-emission of the headlight 200 via the outer lens 230. The vehicle headlight 200 can also be provided with the semiconductor light-emitting apparatus 10 having a high reliability, which can be maintained at a high quality even when it has been used for a long time under a harsh condition as described above. Thus, the first embodiment can provide reliable vehicle headlights even when the semiconductor light-emitting apparatus 10 has been emitted for a long time in the small sealed housing 212.

In the first, second and third embodiments, the semiconductor light-emitting apparatus 20 including the optical fiber 17 can also be used as a light source for the vehicle headlights 100, 150 and 200 by separating the light source module 1A excluding the connecting pipe 18 from the wavelength converting module 2 instead of the semiconductor light-emitting apparatus 10 described above. In these cases, the light source incorporated in the headlights can be minify and temperatures in the headlights can be increased by separating the light source module 1A excluding the connecting pipe 18 from each of the headlights. Therefore, the headlights using the semiconductor light-emitting apparatus 20 of the second embodiment can further enhance each of the reliabilities. Additionally, the headlights using the semiconductor light-emitting apparatus 10B including the light-absorbing layer 3C shown in FIG. 8B can provide a light distribution pattern having a high contrast between a light-emitting region and a non-light-emitting region.

As described above, the disclosed subject matter can form a light-emitting surface in a small shape, which can emit the high-intensity mixture light including a substantially white light, such that is simple to use as a light source for a vehicle headlight, and can improve the reliability by using the metallic bump 5 to attach the wavelength converting layer 3 to the base 4. In addition, the semiconductor light-emitting apparatus can form a light distribution pattern including a light-emitting line having a high contrast by using the reflective layer 9, which is located adjacent the outer surface 3b of the wavelength converting layer 3. Thus, the disclosed subject matter can provide a reliable semiconductor light-emitting device having a small light-emitting surface and a high thermal resistance, which can be used for lighting units such as a vehicle headlight that controls light emitted from the light-emitting apparatus using a reflector and/or a projector lens.

Moreover, for example, at least one of the light-absorbing layer 3C and the mask 3M can be disposed on the top surface 9a of the reflective layer 9 and the top surface 3a of the wavelength converting layer 3, respectively. Thus, the disclosed subject matter can provide a semiconductor light-emitting apparatus capable of being used as a lighting unit, which can project various light distribution patterns having a high contrast between the light-emitting region and the non-light-emitting region.

Furthermore, the above-described embodiments are mainly described as a light source device for a vehicle headlight. However, the semiconductor light-emitting apparatus can incorporate various colored lights by combining the above-described semiconductor chip 11 with the wavelength converting layer 3 including at least one phosphor, and therefore can also be used as a light source device for various applications such as general lighting, a street light, stage lighting, traffic lights and the like using a small and simple optical member. In addition, it is conceived that each of the different aspects and features of the different embodiments disclosed herein could be used interchangeably in and with the other disclosed embodiments. For example, it is contemplated that any different color chip or different wavelength material can be used in any of the disclosed embodiments and in any combination. Moreover, each of the specifically referenced features of each of the disclosed embodiments can be interchanged with each other in the various embodiments in all possible combinations of the referenced features.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entireties by reference.

What is claimed is:

1. A semiconductor light-emitting apparatus comprising:
    a light source module including;
        a stem having a stem top surface and a stem outer circumference located on the stem top surface,
        a semiconductor light-emitting device having an optical axis mounted on the stem top surface of the stem,
        a casing having a light-emitting window formed in a dome shape, being attached to the stem outer circumference of the stem top surface of the stem, and the light-emitting window of the casing being configured to transmit light emitted from the semiconductor light-emitting device along the optical axis of the semiconductor light-emitting device, and
        a connecting pipe formed in a substantially tubular shape, attached to the casing, extending in an opposite direction of the semiconductor light-emitting device, and being configured to transmit the light emitted from the semiconductor light-emitting device along the optical axis of the semiconductor light-emitting device; and
    a wavelength converting module including;
        a wavelength converting layer having a top surface and a wavelength converting outer side surface including a phosphor layer, a light-diffusing layer having a light-diffusing top surface and a light-diffusing bottom surface disposed underneath the phosphor layer, a dielectric layer having a dielectric bottom surface and a dielectric outer circumference included on the dielectric bottom surface and a reflective layer, the dielectric layer being located underneath the light-diffusing bottom surface of the light-diffusing layer, and the reflective layer located underneath the dielectric outer circumference of the dielectric layer in an opposite direction of the light-diffusing layer,
        a base having a mounting board, a flange and an opening passing through the mounting board and the flange, the flange of the base having a flange top surface and a flange outer circumference located on the flange top surface in an opposite direction of the opening, and connecting to the connecting pipe of the light source module, the mounting board of the base having a mounting top surface and a mounting outer side surface located in an opposite direction of the opening, and being located on the flange top surface of the flange, wherein the optical axis of the semiconductor light-emitting device passes through the opening of the base,
        a contact layer having a first contact layer and a second contact layer, the first contact layer disposed underneath the reflective layer of the wavelength converting layer, and the second contact layer disposed on the mounting top surface of the mounting board,
        a plurality of metallic bumps attached between the first contact layer and the second contact layer of the contact layer, and thereby attaching the wavelength converting layer to the base,
        a first frame having a first top surface and a first inner surface formed in a substantially planar ring shape, attached to at least one of the second contact layer of the contact layer and the mounting top surface of the mounting board, the first inner surface of the first frame contacting with the wavelength converting outer side surface of the wavelength converting layer, and the first top surface of the first frame located between the light-diffusing top surface of the light-diffusing layer and the dielectric bottom surface of the dielectric layer,
        a second frame having a second inner surface formed in a substantially planar ring shape, attached to the base, and the second inner surface of the second frame facing at least the wavelength converting outer surface of the wavelength converting layer, and
        a second reflective layer having a reflective top surface disposed between the second inner surface of the second frame and at least the wavelength converting outer side surface of the wavelength converting layer.

2. The semiconductor light-emitting apparatus according to claim 1, wherein the second frame is attached on the flange outer circumference of the flange top surface of the base, and therefore surrounds the first frame and the mounting board of the base.

3. The semiconductor light-emitting apparatus according to claim 1, further comprising:
    a collecting lens having a lens optical axis attached in the light-emitting window of the casing, and the lens optical axis substantially corresponding to the optical axis of the semiconductor light-emitting device.

4. The semiconductor light-emitting apparatus according to claim 1, wherein the semiconductor light-emitting device is configured with a Transistor Outlined Can-typed (To-Can-typed) semiconductor light-emitting device.

5. The semiconductor light-emitting apparatus according to claim 1, wherein the semiconductor light-emitting device includes at least one blue light-emitting chip and the phosphor layer of the wavelength converting layer is selected from the group consisting of a yellow phosphor, and two phosphors including a red phosphor layer and a green phosphor layer.

6. The semiconductor light-emitting apparatus according to claim 1, wherein the semiconductor light-emitting device includes at least one blue laser chip and the phosphor layer of the wavelength converting layer is an yttrium aluminum garnet phosphor ceramic.

7. The semiconductor light-emitting apparatus according to claim 1, wherein the semiconductor light-emitting device includes at least one ultraviolet light-emitting chip and the phosphor layer of the wavelength converting layer contains at least one of a red phosphor layer, a green phosphor layer and a blue phosphor.

8. The semiconductor light-emitting apparatus according to claim 1, wherein the second frame is integrated with the first frame.

9. The semiconductor light-emitting apparatus according to claim 1, further comprising:
 a light-absorbing layer be disposed in the top surface of the reflective layer.

10. A semiconductor light-emitting apparatus, comprising:
 a light source module including;
  a stem having a stem top surface and a stem outer circumference located on the stem top surface,
  a semiconductor light-emitting device having an optical axis mounted on the stem top surface of the stem,
  a casing including a collecting lens having a lens optical axis, being attached to the stem outer circumference of the stem, and the collecting lens of the casing being configured to transmit light emitted from the semiconductor light-emitting device along the optical axis of the semiconductor light-emitting device, and
  a connecting guide including a optical fiber having a fiber connecter and a fiber end, formed in a substantially tubular shape, and attaching the optical fiber in the connecting guide, and also the optical fiber attached to the casing by the fiber connecter and being configured to transmit the light emitted from the semiconductor light-emitting device toward the fiber end through the optical fiber; and
 a wavelength converting module including;
  a wavelength converting layer having a top surface and a wavelength converting outer side surface including a phosphor layer, a light-diffusing layer having a light-diffusing top surface and a light-diffusing bottom surface disposed underneath the phosphor layer, a dielectric layer having a dielectric bottom surface and a dielectric outer circumference included on the dielectric bottom surface and a reflective layer, the dielectric layer being located underneath the light-diffusing bottom surface of the light-diffusing layer, and the reflective layer located underneath the dielectric outer circumference of the dielectric layer in an opposite direction of the light-diffusing layer, wherein the fiber end of the optical fiber contacts with a middle portion of the dielectric bottom surface of the dielectric layer,
  a base having a mounting board, a flange and an opening passing through the mounting board and the flange, the flange of the base having a flange top surface and a flange outer circumference located on the flange top surface in an opposite direction of the opening, and connecting to the connecting guide of the light source module, the mounting board of the base having a mounting top surface and a mounting outer side surface located in an opposite direction of the opening, and being located on the flange top surface of the flange,
  a contact layer having a first contact layer and a second contact layer, the first contact layer disposed underneath the reflective layer of the wavelength converting layer, and the second contact layer disposed on the mounting top surface of the mounting board,
  a plurality of metallic bumps attached between the first contact layer and the second contact layer of the contact layer, and thereby attaching the wavelength converting layer to the base,
  a first frame having a first top surface and a first inner surface formed in a substantially planar ring shape, attached to at least one of the second contact layer of the contact layer and the mounting top surface of the mounting board, the first inner surface of the first frame contacting with the wavelength converting outer surface of the wavelength converting layer, and the first top surface of the first frame located between the light-diffusing top surface of the light-diffusing layer and the dielectric bottom surface of the dielectric layer,
  a second frame having a second inner surface formed in a substantially planar ring shape, attached to the base, and the second inner surface of the second frame facing at least the wavelength converting outer surface of the wavelength converting layer, and
  a second reflective layer disposed between the second inner surface of the second frame and at least the wavelength converting outer surface of the wavelength converting layer.

11. The semiconductor light-emitting apparatus according to claim 10, wherein the second frame is attached on the flange outer circumference of the flange top surface of the base, and therefore surrounds the first frame and the mounting board of the base.

12. The semiconductor light-emitting apparatus according to claim 10, wherein the second frame is integrated with the first frame.

13. The semiconductor light-emitting apparatus according to claim 10, wherein the semiconductor light-emitting device is configured with a Transistor Outlined Can-typed (To-Can-typed) semiconductor light-emitting device.

14. The semiconductor light-emitting apparatus according to claim 10, wherein the semiconductor light-emitting device includes at least one blue light-emitting chip and the phosphor layer of the wavelength converting layer is selected from the group consisting of a yellow phosphor, and two phosphors including a red phosphor layer and a green phosphor layer.

15. The semiconductor light-emitting apparatus according to claim 10, wherein the semiconductor light-emitting device includes at least one blue laser chip and the phosphor layer of the wavelength converting layer is an yttrium aluminum garnet phosphor ceramic.

16. The semiconductor light-emitting apparatus according to claim 10, wherein the semiconductor light-emitting device includes at least one ultraviolet light-emitting chip and the phosphor layer of the wavelength converting layer contains at least one of a red phosphor layer, a green phosphor layer and a blue phosphor.

17. A vehicle headlight including the semiconductor light-emitting apparatus according to claim 1, further comprising:
 a housing;
 at least one ellipsoidal reflector having a central axis, a first focus and a second focus located substantially on the central axis, and the reflector located adjacent the housing, the first focus of the ellipsoidal reflector being located substantially at the top surface of the wavelength converting layer of the semiconductor light-emitting apparatus so that the optical axis of the semiconductor light-emitting device of the semiconductor light-emitting apparatus intersects with the central axis of the ellipsoidal reflector;
 a projector lens having an optical axis and at least one focus located toward the ellipsoidal reflector on the optical axis, the optical axis of the projector lens corresponding substantially to the central axis of the ellipsoidal reflector, and the focus of the projector lens being located substantially at the second focus of the ellipsoidal reflector; and a shade having a top surface located between the projector lens and the ellipsoidal reflector, and the top surface of the shade being located substantially at the second focus of the ellipsoidal reflector.

18. A vehicle headlight including the semiconductor light-emitting apparatus according to claim 1, further comprising:

a projector lens having an optical axis and at least one focus located on the optical axis, the optical axis substantially corresponding to the optical axis of the semiconductor light-emitting device of the semiconductor light-emitting apparatus, and the focus of the projector lens being located substantially at the top surface of the wavelength converting layer of the semiconductor light-emitting apparatus.

19. The vehicle headlight including the semiconductor light-emitting apparatus according to claim 18, further comprising:

a mask being located the top surface of the wavelength converting layer of the semiconductor light-emitting apparatus.

20. A vehicle headlight including the semiconductor light-emitting apparatus according to claim 1, further comprising:

a housing;

at least one parabolic reflector having a central axis, an opening and a focus located on the central axis, and located adjacent the housing, and the focus of the parabolic reflector being located substantially at the top surface of the wavelength converting layer of the semiconductor light-emitting apparatus, the optical axis of the semiconductor light-emitting device intersecting with the central axis of the parabolic reflector; and an outer lens being located at the opening of the parabolic reflector so as to cover the opening of the parabolic reflector.

* * * * *